(12) United States Patent
Matsumoto et al.

(10) Patent No.: US 7,786,056 B2
(45) Date of Patent: Aug. 31, 2010

(54) HEAT DISSIPATING SILICONE GREASE COMPOSITIONS

(75) Inventors: Nobuaki Matsumoto, Annaka (JP); Kunihiro Yamada, Annaka (JP); Kei Miyoshi, Annaka (JP); Ikuo Sakurai, Annaka (JP); Kenichi Isobe, Annaka (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 199 days.

(21) Appl. No.: 12/059,138

(22) Filed: Mar. 31, 2008

(65) Prior Publication Data

US 2008/0269084 A1 Oct. 30, 2008

(30) Foreign Application Priority Data

Apr. 26, 2007 (JP) .............................. 2007-116598

(51) Int. Cl.
- *A61K 9/00* (2006.01)
- *C10M 173/02* (2006.01)
- *C10M 169/04* (2006.01)
- *C10F 7/02* (2006.01)

(52) U.S. Cl. .................. 508/208; 508/173; 508/201

(58) Field of Classification Search ................. 508/208, 508/201, 202, 126, 173
See application file for complete search history.

(56) References Cited

U.S. PATENT DOCUMENTS 6,136,758 A 10/2000 Yamada et al.
6,174,841 B1 1/2001 Yamada et al.
6,372,337 B2 4/2002 Takahashi et al.
6,818,600 B2 11/2004 Yamada et al.
2005/0110133 A1 5/2005 Yamada et al.

FOREIGN PATENT DOCUMENTS

| | | |
|---|---|---|
| EP | 0 896 031 A2 | 2/1999 |
| EP | 0 991 120 A3 | 4/2001 |
| EP | 1 535 988 A1 | 6/2005 |
| EP | 1 600 494 A1 | 11/2005 |
| EP | 1 754 772 A1 | 2/2007 |
| EP | 1 803 798 A2 | 7/2007 |
| JP | 2000-63872 | 2/2000 |
| JP | 2000-63873 | 2/2000 |
| JP | 2000-109373 | 4/2000 |
| JP | 2000-114438 | 4/2000 |
| JP | 2000-129160 | 5/2000 |
| JP | 2003-301189 | 10/2003 |
| JP | 2005-154532 | 6/2005 |

*Primary Examiner*—Walter D Griffin
*Assistant Examiner*—Frank C Campanell
(74) *Attorney, Agent, or Firm*—Oblon, Spivak, McClelland, Maier & Neustadt, L.L.P.

(57) ABSTRACT

A silicone grease composition comprising 3-30 wt % of an organopolysiloxane and 60-96.9 wt % of a heat conductive filler is diluted with a least volatile isoparaffin having a boiling point of 260-360° C. Despite a heavy loading of heat conductive filler, the grease composition is easily applicable to heat sinks as a thin uniform coating. The composition is drastically increased in shelf stability at room temperature, easy to handle, and provides for good heat dissipation.

20 Claims, 1 Drawing Sheet

HEAT DISSIPATING SILICONE GREASE COMPOSITIONS

CROSS-REFERENCE TO RELATED APPLICATION

This non-provisional application claims priority under 35 U.S.C. §119(a) on Patent Application No. 2007-116598 filed in Japan on Apr. 26, 2007, the entire contents of which are hereby incorporated by reference.

TECHNICAL FIELD

This invention relates to heat dissipating silicone grease compositions which are effectively applicable and stable during storage in a rigorous environment.

BACKGROUND ART

On use, many electric components generate heat. For proper functioning of the electric component, it is necessary to remove the heat from the component. For heat removal, a number of heat conductive materials have been proposed. See JP-A 2000-63872, JP-A 2000-63873, JP-A 2000-109373, JP-A 2000-114438, JP-A 2000-129160, and JP-A 2003-301189.

The heat conductive materials generally take two forms, a sheet form which is easy to handle and a paste form commonly known as heat dissipating grease. While the heat dissipating grease suffers from a problem of cumbersome handling, one approach for overcoming the problem is to fill a syringe with the grease so that the grease may be applied by a dispensing machine. When it is desired to apply the grease to a member having a relatively large area, a printing technique using a metal screen or stencil is more efficient and accurate in applying the grease than the dispensing machine. The printing technique uses a squeegee in combination with a metal plate of stainless steel or the like having a desired pattern cut out. By moving the squeegee, the heat-dissipating grease is spread over the metal plate and thus coated onto a heat sink or similar member. The coating operation becomes difficult as the grease increases its viscosity.

The pursuit of the heat conduction capability of heat-dissipating grease leads to an increased loading of heat conductive filler in grease, resulting in grease with a higher viscosity. As a solution to this problem, it was already proposed to dilute a highly heat conductive silicone grease with a volatile solvent (see JP-A 2005-154532). However, it is understood as a matter of course that if the solvent volatilizes off prior to use, the grease experiences a rapid buildup of viscosity to such an extent to hinder screen printing. Differently stated, there is a strong likelihood that the grease ceases to exert its coating feasibility if the grease is stored for a long period over its expiration date, or if the container is opened and closed many times because the full content cannot be consumed at a time, or at worst, if the container is kept open for a long time until the content is used up. In fact, a laboratory follow-up test using a container filled with the heat-dissipating silicone grease composition of JP-A 2005-154532 demonstrated that when the lid of the container was kept open for 15 days at room temperature, the silicone grease increased its viscosity to such a level as to interfere with coating and working operation.

From the working standpoint, there is a need to have a heat-dissipating silicone grease composition which experiences no or little viscosity buildup even when the lid of the container is kept open at room temperature.

DISCLOSURE OF THE INVENTION

An object of the invention is to provide a heat-conductive silicone grease composition for heat dissipation which does not lose its applicability by a printing method such as metal screen printing even when the lid of the container is kept open at room temperature.

The inventors have found that when a heat-dissipating silicone grease composition comprising organopolysiloxanes (A) and (B) as defined below and a heavy loading of a heat conductive filler is diluted with a minor amount of a least volatile isoparaffin compound having a boiling point of 260 to 360° C., the resulting composition exhibits only a minimal change of viscosity, a high shelf stability at room temperature, and effective application.

The invention provides a heat dissipating silicone grease composition comprising, in % by weight, as essential components, (A) 0 to 30% of an organopolysiloxane represented by the general formula (1):

wherein $R^1$ is at least one radical selected from substituted or unsubstituted monovalent hydrocarbon radicals of 1 to 18 carbon atoms, and "a" is a positive number from 1.8 to 2.2, and having a kinematic viscosity of 50 to 500,000 mm²/s at 25° C., (B) 0 to 30% of an organopolysiloxane represented by the general formula (2):

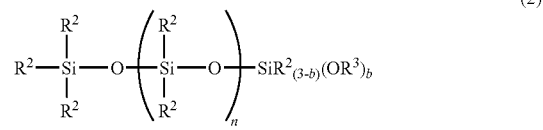

wherein $R^2$ is each independently a substituted or unsubstituted monovalent hydrocarbon radical, $R^3$ is each independently an alkyl, akoxyalkyl, alkenyl or acyl radical, n is an integer of 5 to 100, and "b" is an integer of 1 to 3, the sum of components (A) and (B) being in a range of 3 to 30%, (C) 60 to 96.9% of a heat conductive filler having a heat conductivity of at least 10 W/m° C., (D) 0.1 to 10% of a least volatile isoparaffin having a boiling point of 260 to 360° C., in which components (A) and (B) are dispersible or dissolvable, the sum of components (A) to (D) being 100%.

In a preferred embodiment, an organosilane having the general formula (3) or a partial hydrolytic condensate thereof may be compounded in an amount of 0.1 to 10 parts by weight per 100 parts by weight of components (A) to (D) combined.

Herein $R^4$ is a substituted or unsubstituted alkyl radical of 6 to 20 carbon atoms, $R^5$ is a substituted or unsubstituted monovalent hydrocarbon radical of 1 to 20 carbon atoms, $R^6$ is an alkyl radical of 1 to 6 carbon atoms, c is an integer of 1 to 3, d is an integer of 0 to 2, and c+d is an integer of 1 to 3.

BENEFITS OF THE INVENTION

Despite a heavy loading of heat conductive filler, the heat-dissipating silicone grease composition of the invention is easily applicable to heat sinks or similar members as a thin uniform coating by a printing method such as metal screen printing. Since a high boiling solvent is used as the diluent, the composition is drastically increased in shelf stability at room temperature. Since the heat-dissipating silicone grease composition of high boiling solvent dilution experiences no or little viscosity buildup when the lid of the container is kept open during use, the composition is easy to handle on field use. Simply by effecting a volatilizing step on a thin coating of the composition, the coating is converted to a film having a heat dissipation capability.

DESCRIPTION OF THE PREFERRED EMBODIMENT

Figure 1:
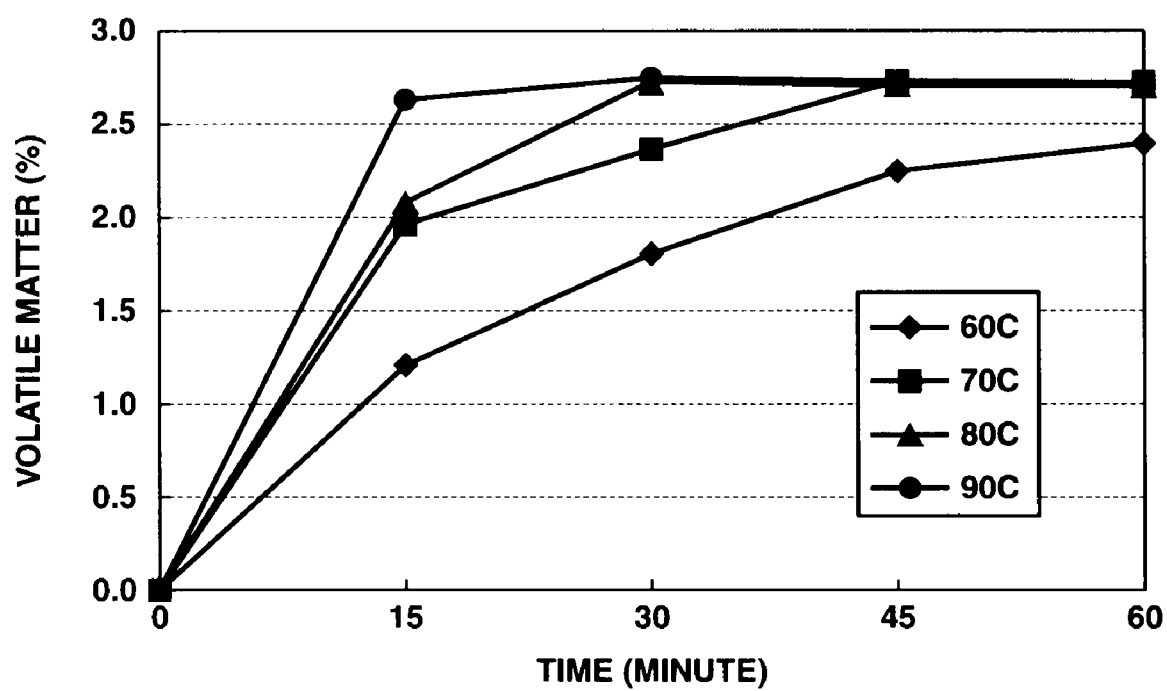
FIG. 1 is a graph showing changes with time of volatile matter from the silicone grease composition of Example 1 when heated at different temperatures.

The composition of the invention consists essentially of components (A) to (D) while the amounts of these components are expressed in % by weight, provided that the sum of components (A) to (D) is 100% by weight. As to the percent amount, the composition is equivalent to the sum of components (A) to (D).

In the heat-dissipating silicone grease composition of the invention, component (A) is an organopolysiloxane represented by the general formula (1).

Herein $R^1$ is at least one radical selected from substituted or unsubstituted monovalent hydrocarbon radicals of 1 to 18 carbon atoms. Examples include alkyl radicals such as methyl, ethyl, propyl, pentyl, hexyl, heptyl, octyl, nonyl, decyl, dodecyl, tetradecyl, hexadecyl and octadecyl, cycloalkyl radicals such as cyclopentyl and cyclohexyl, alkenyl radicals such as vinyl and allyl, aryl radicals such as phenyl and tolyl, aralkyl radicals such as 2-phenylethyl and 2-methyl-2-phenylethyl, and halogenated hydrocarbon radicals such as 3,3,3-trifluoropropyl, 2-(perfluorobutyl)ethyl, 2-(perfluorooctyl)ethyl and p-chlorophenyl. Of these, methyl, phenyl, and alkyl radicals of 6 to 14 carbon atoms are preferred. The subscript "a" is a positive number from 1.8 to 2.2, and preferably from 1.9 to 2.2, when the viscosity required as silicone grease compositions is taken into account.

The organopolysiloxane (A) should have a kinematic viscosity of 50 to 500,000 mm$^2$/s at 25° C. If the kinematic viscosity is lower than 50 mm$^2$/s, the resulting grease composition is prone to oil bleeding. If the kinematic viscosity is higher than 500,000 mm$^2$/s, the resulting grease composition becomes less spreadable. A kinematic viscosity of 100 to 10,000 mm$^2$/s at 25° C. is preferred.

Note that the kinematic viscosity is measured at 25° C. by an Ostwald viscometer.

Component (A) is present in an amount of 0 to 30% by weight based on the composition. More than 30 wt % of component (A) leads to a lower heat conductivity. The preferred amount of component (A) is 0 to 15 wt %.

Preferred illustrative examples of component (A) are given below. Throughout the specification, Me stands for methyl.

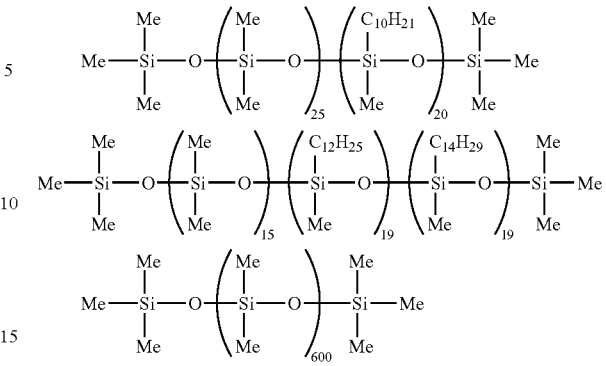

Component (B) is an organopolysiloxane represented by the general formula (2).

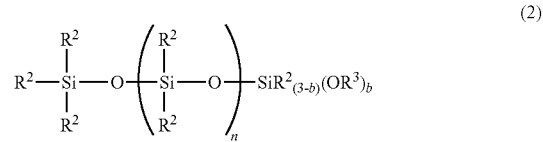

Herein $R^2$ is each independently a substituted or unsubstituted monovalent hydrocarbon radical, $R^3$ is each independently an alkyl, akoxyalkyl, alkenyl or acyl radical, n is an integer of 5 to 100, and "b" is an integer of 1 to 3.

Component (B) serves to maintain the flow and impart ease of handling to the composition even when the composition is heavily loaded with heat conductive filler (C) in order to provide a highly heat conductive silicone composition. Either one or both of components (A) and (B) may be used. Component (B) may be used alone or in a mixture of two or more.

In formula (2), $R^2$ is each independently a substituted or unsubstituted monovalent hydrocarbon radical. Such hydrocarbon radicals are preferably of 1 to 18 carbon atoms, and include straight alkyl, branched alkyl, cyclic alkyl, alkenyl, aryl, aralkyl, and halogenated alkyl radicals. Exemplary of straight alkyl radicals are methyl, ethyl, propyl, hexyl, and octyl. Exemplary of branched alkyl radicals are isopropyl, isobutyl, tert-butyl, and 2-ethylhexyl. Exemplary of cyclic alkyl radicals are cyclopentyl and cyclohexyl. Exemplary alkenyl radicals include vinyl and allyl. Exemplary aryl radicals include phenyl and tolyl. Exemplary aralkyl radicals include 2-phenylethyl and 2-methyl-2-phenylethyl. Exemplary halo-alkyl radicals include 3,3,3-trifluoropropyl, 2-(nonafluorobutyl)ethyl, and 2-(heptadecafluorooctyl)ethyl. Preferably, $R^2$ is methyl or phenyl.

$R^3$ is each independently an alkyl, akoxyalkyl, alkenyl or acyl radical, preferably of 1 to 5 carbon atoms. Exemplary alkyl radicals include straight, branched and cyclic alkyl radicals as exemplified for $R^2$. Exemplary alkoxyalkyl radicals include methoxyethyl and methoxypropyl. Exemplary acyl radicals include acetyl and octanoyl. Preferably $R^3$ is alkyl, with methyl and ethyl being more preferred. The subscript n is an integer of 5 to 100, and "b" is an integer of 1 to 3, and preferably 3.

The organopolysiloxane (B) generally has a kinematic viscosity of 10 to 10,000 mm$^2$/s at 25° C. If the kinematic viscosity is lower than 10 mm$^2$/s, the resulting grease composition may be prone to oil bleeding. If the kinematic viscosity is higher than 10,000 mm²/s, the resulting grease composition may become less flowable. A kinematic viscosity of 10 to 5,000 mm²/s at 25° C. is preferred.

Component (B) is present in an amount of 0 to 30% by weight based on the composition. More than 30% by weight of component (B) leads to a lower heat conductivity. The preferred amount of component (B) is 0 to 15% by weight.

The sum of components (A) and (B) should be in a range of 3 to 30% by weight based on the composition. If the sum is less than 3 wt %, the resulting composition loses grease nature and becomes less spreadable. If the sum is more than 30 wt %, the composition becomes less heat conductive.

Preferred illustrative examples of component (B) are given below.

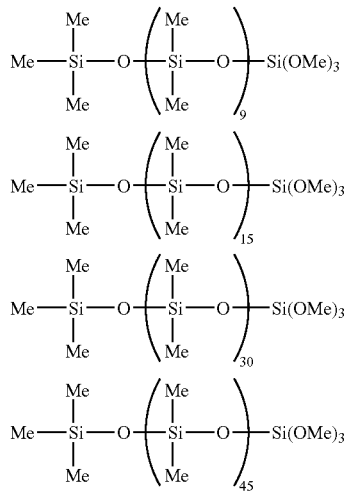

Component (C) is a heat conductive filler. The filler should have a thermal conductivity of at least 10 W/m° C. If a filler with a thermal conductivity of less than 10 W/m° C. is used, the silicone grease composition also has a lower than desired thermal conductivity. Examples of the heat conductive filler include aluminum powder, copper powder, silver powder, nickel powder, gold powder, alumina powder, zinc oxide powder, magnesium oxide powder, aluminum nitride powder, boron nitride powder, silicon nitride powder, diamond powder and carbon powder. Any desired filler can be used as long as it has a thermal conductivity of at least 10 W/m° C. A powder of one type or a mixture of two or more types may be used.

The silicone grease composition should contain 60 to 96.9% by weight, and preferably 80 to 95% by weight of the heat conductive filler. Less than 60% by weight of the heat conductive filler fails to provide the desired heat conductivity whereas a composition with more than 96.9% by weight of the filler loses grease nature and becomes less spreadable.

The heat conductive filler is typically particulate and may be of any desired shape including irregular and spherical shapes. Preferably the heat conductive filler has an average particle size in the range of 0.1 to 100 μm. With an average particle size of less than 0.1 μm, the composition loses grease nature and becomes less spreadable. If the average particle size is more than 100 μm, the grease composition loses uniformity. As used herein, the "average particle size" is a volume average value $D_{50}$ (particle diameter when the cumulative volume reaches 50%, or median diameter) on particle size distribution measurement by the laser light diffraction method.

Component (D) is a diluent which is a least volatile isoparaffin having a boiling point of 260 to 360° C. because of safety, hygiene, and printing efficiency. As used herein, the term "least volatile" means that the substance is substantially nonvolatile at room temperature. A diluent with a boiling point below 260° C. will volatilize off during room-temperature use in some service environments. In fact, it was empirically found that when a container filled with a heat dissipating silicone grease was held at room temperature with its lid kept open, the grease increased its viscosity with the lapse of time, and after about 15 days reached a detrimental level to coating and working. If a diluent with a boiling point above 360° C. is used, the majority thereof is left in the silicone grease, adversely affecting the heat dissipation properties. That is, a heat dissipating silicone grease composition diluted with a least volatile isoparaffin having a boiling point of 260 to 360° C. maintains its viscosity substantially constant when the lid of the container is kept open at room temperature, because the diluent volatilizes little. The use of a least volatile isoparaffin has an additional advantage that a silicone grease coating which is thinly coated by screen printing resumes its heat dissipating properties simply by adding the step of heating at 70 to 80° C. for volatilization.

The isoparaffin is present in an amount of 0.1 to 10% by weight and preferably 0.5 to 5% by weight of the composition. Less than 0.1 wt % of isoparaffin fails to fully reduce the viscosity of the silicone grease composition. If the amount of isoparaffin is more than 10 wt %, the filler will settle down fast, which is detrimental to the shelf stability of the silicone grease composition.

Since the heat conductivity of a heat dissipating silicone grease composition is essentially correlated to a loading of heat conductive filler, it is usually advantageous to load the filler as much as possible. However, as a matter of course, increasing the loading of heat conductive filler provides a silicone grease composition with an increased viscosity. Then handling and working considerations impose a certain limit on the loading of heat conductive filler. Now that the addition of a minor amount of component (D) achieves a drastic drop in the viscosity of a silicone grease composition, the silicone grease composition which is loaded with a larger amount of heat conductive filler than in the prior art can be effectively handled and worked. Additionally, the use of an isoparaffin having a higher boiling point than the existing solvents ensures that the silicone grease composition maintains a constant viscosity even when exposed to the ambient air at room temperature over a long term.

In the process, the silicone grease composition is thinly coated onto a heat sink or other member by a printing method such as metal screen printing, and the coating is heated for volatilizing off the diluent. In this way, a highly heat conductive coating of silicone grease composition which is heavily loaded with a heat conductive filler can be readily formed as a uniform thin film independent of the service environment, as opposed to the prior art compositions which are prohibited from heavy loading.

In a preferred embodiment, an organosilane having the general formula (3):

$$R^4{}_c R^5{}_d Si(OR^6)_{4-c-d} \quad (3)$$

wherein $R^4$ is a substituted or unsubstituted alkyl radical of 6 to 20 carbon atoms, $R^5$ is a substituted or unsubstituted monovalent hydrocarbon radical of 1 to 20 carbon atoms, $R^6$ is an alkyl radical of 1 to 6 carbon atoms, c is an integer of 1 to 3, d is an integer of 0 to 2, and c+d is an integer of 1 to 3, or a partial hydrolytic condensate thereof may be added to the heat dissipating silicone grease composition. The organosilane is effective for improving the moisture resistance of heat conductive filler through physical and chemical adsorption to the filler surface, and thus effective for helping the silicone grease composition to maintain its thermal properties in a humid environment.

In formula (3), $R^4$ is a substituted or unsubstituted monovalent alkyl radical of 6 to 20 carbon atoms. Examples include hexyl, octyl, decyl, dodecyl, tetradecyl, hexadecyl and octadecyl, with those alkyl radicals of 6 to 14 carbon atoms being preferred.

$R^5$ is a substituted or unsubstituted monovalent hydrocarbon radical of 1 to 20 carbon atoms or a mixture thereof, and preferably different from $R^4$. Examples include alkyl radicals such as methyl, ethyl, propyl, hexyl, octyl, decyl, dodecyl, tetradecyl, hexadecyl and octadecyl, cycloalkyl radicals such as cyclopentyl and cyclohexyl, alkenyl radicals such as vinyl and allyl, aryl radicals such as phenyl and tolyl, aralkyl radicals such as 2-phenylethyl and 2-methyl-2-phenylethyl, and halogenated hydrocarbon radicals such as 3,3,3-trifluoropropyl, 2-(perfluorobutyl)ethyl, 2-(perfluorooctyl)ethyl and p-chlorophenyl. Of these, methyl is most preferred.

$R^6$ is an alkyl radical of 1 to 6 carbon atoms such as methyl, ethyl, propyl, butyl and pentyl or a mixture thereof. Inter alia, methyl and ethyl are preferred. The subscript c is an integer of 1 to 3, d is an integer of 0 to 2, and the sum of c+d is equal to 1, 2 or 3, and preferably equal to 1.

The amount of organosilane added is 0.1 to 10 parts by weight per 100 parts by weight of the composition consisting of components (A) to (D). Less than 0.1 pbw of the organosilane fails to provide the heat conductive filler with water resistance whereas more than 10 pbw of the organosilane exerts no further effect and is uneconomical.

The grease composition of the invention is prepared by mixing components (A) to (D) and optionally, organosilane on a mixer. Examples of useful mixers or kneaders include Tri-Mix® mixer, Twin-Mix®mixer, and planetary mixer (all Inoue Mfg., Inc.), Ultra Mixer® (Mizuho Industry K.K.), and Hivis Disper Mix® mixer (Primix Corp.).

The silicone grease composition is coated onto a heat sink or other member to a coating thickness of 100 to 120 μm and heated at 80 to 90° C. for 30 to 45 minutes whereupon a heat dissipating coat is obtained.

EXAMPLE

Examples of the invention are given below by way of illustration and not by way of limitation.

For evaluation, the compositions were examined by the following tests.

Applicability

Using a squeegee in combination with a stainless steel plate of 120 μm thick having an opening of 3 cm square cut-out as a metal screen, a silicone grease composition was coated onto a heat sink. Applicability was examined on both a fresh composition and an aged composition after open exposure at room temperature for 15 days.

Rating
○: uniform coating over entire surface
Δ: some variations on grease surface
X: grease stuck on squeegee and prohibited coating Determination of Diluent Volatilizing Conditions Using a metal screen, the silicone grease composition of Example 1 in Table 1 was coated onto an aluminum plate to form a plurality of coatings dimensioned 25 mm×25 mm×120 μm (thick). The coatings were allowed to stand at different temperatures while monitoring the changes of volatile matter with the lapse of time. The results are plotted in FIG. 1. From the test results, the step of heating at 80° C. for 45 minutes is selected for volatilization.

Heat Conductivity

The thickness of a silicone grease composition layer was computed by measuring the overall thickness of a test piece having the grease layer between a pair of aluminum plates by a micrometer (Mitsutoyo Co., Ltd.) and subtracting the thickness of two aluminum plates from the overall thickness. In this way, several test pieces having grease layers with different thickness were prepared. Where the volatilizing step is necessary, a small mass of the composition was rested on an aluminum plate and heated at 80° C. for 45 minutes, before test pieces having grease layers with different thickness were prepared. The thermal resistance ($mm^2$-K/W) of the silicone grease composition was measured at 25° C. using the test piece and a thermal resistance analyzer based on the laser flash method (xenon flash lamp analyzer LFA447 NanoFlash® by Netzsch GmbH). For each grease composition, the thermal resistance values of grease are plotted as a function of thickness to draw a straight line, and a heat conductivity was computed from the reciprocal of a gradient of that line.

Viscosity

The absolute viscosity of a composition was measured at 25° C. by a Malcom viscometer (Type PC-1T). A 500-g portion of each composition was weighed and placed in a beaker, which was kept open at 25° C. A change of viscosity with the lapse of time was monitored, with the results shown in Tables 1 and 2.

Examples 1 to 7 and Comparative Examples 1 to 6

Heat dissipating silicone grease compositions were prepared by feeding the predetermined amounts of the components shown in Tables 1 and 2 to a 5-liter planetary mixer (trade name of Inoue Mfg. Inc.), and agitating them at room temperature for one hour. The properties of these (fresh) silicone grease compositions were tested, with the results shown in Tables 1 and 2. The silicone grease compositions were subjected to open exposure at 25° C. for 15 days. The results of viscosity monitoring and the applicability of the aged compositions are also shown in Tables 1 and 2.

TABLE 1

|  |  |  | Example | | | | | | |
|---|---|---|---|---|---|---|---|---|---|
| Component | | | 1 | 2 | 3 | 4 | 5 | 6 | 7 |
| Formulation (wt %) | Component (A) | A-1 | 7.0 | 9.0 | 16.3 | 7.0 | | | |
| | | A-2 | | | | | | 7.0 | |
| | | A-3 | | | | | | | 3.5 |

TABLE 1-continued

|  | Component |  | Example 1 | 2 | 3 | 4 | 5 | 6 | 7 |
|---|---|---|---|---|---|---|---|---|---|
|  | Component (B) | B-1 |  |  |  |  |  | 3.5 | 7.0 |
|  | Component (C) | C-1 | 70.3 | 69.8 |  | 20.0 | 70.3 |  | 71.0 |
|  |  | C-2 | 20.0 | 19.9 | 81.7 | 20.0 | 20.0 | 20.0 | 20.0 |
|  |  | C-3 |  |  |  | 71.0 |  | 71.0 |  |
|  | Component (D) | D-1 | 2.0 | 1.0 | 2.0 | 2.0 | 2.0 | 2.0 | 2.0 |
|  |  | D-2 |  |  |  |  |  |  |  |
|  | Organosilane-1 |  | 0.7 | 0.3 |  |  | 0.7 |  |  |
| Initial viscosity (Pa-s) |  |  | 190 | 200 | 170 | 170 | 210 | 200 | 100 |
| Initial applicability |  |  | ○ | ○ | ○ | ○ | ○ | ○ | ○ |
| Heat conductivity of composition before diluent addition (W/m ° C.) |  |  | 6.0 | 4.6 | 2.9 | 3.2 | 3.5 | 3.2 | 6.1 |
| Heat conductivity of composition with diluent added (W/m ° C.) |  |  | 4.0 | 3.7 | 2.5 | 2.7 | 2.9 | 2.7 | 4.1 |
| Heat conductivity of composition with diluent volatilized off (W/m ° C.) |  |  | 5.8 | 4.5 | 2.9 | 3.1 | 3.4 | 3.2 | 6.0 |
| Absolute viscosity after 5 days (Pa-s) |  |  | 190 | 200 | 170 | 170 | 210 | 200 | 100 |
| Absolute viscosity after 8 days (Pa-s) |  |  | 190 | 200 | 170 | 170 | 210 | 200 | 100 |
| Absolute viscosity after 15 days (Pa-s) |  |  | 200 | 210 | 175 | 180 | 210 | 200 | 100 |
| Applicability after 15 days |  |  | ○ | ○ | ○ | ○ | ○ | ○ | ○ |

TABLE 2

|  | Component |  | Comparative Example 1 | 2 | 3 | 4 | 5 | 6 |
|---|---|---|---|---|---|---|---|---|
| Formulation (wt %) | Component (A) | A-1 | 7.0 | 6.2 | 2.9 |  | 7.0 |  |
|  |  | A-2 |  |  |  |  |  |  |
|  |  | A-3 |  |  |  |  |  |  |
|  | Component (B) | B-1 |  |  |  | 2.9 |  | 7.0 |
|  | Component (C) | C-1 | 72.0 | 62.8 | 74.0 | 74.0 | 70.3 | 71.0 |
|  |  | C-2 | 20.5 | 18.0 | 21.1 | 21.1 | 20.0 | 20.0 |
|  |  | C-3 |  |  |  |  |  |  |
|  | Component (D) | D-1 | 0.07 | 12.4 | 2.0 | 2.0 |  |  |
|  |  | D-2 |  |  |  |  | 2.0 | 2.0 |
|  | Organosilane-1 |  | 0.7 | 0.6 |  |  | 0.6 | 0.7 |
| Initial viscosity (Pa-s) |  |  | 600 | grease separated | non-grease | non-grease | 190 | 100 |
| Initial applicability |  |  | X |  |  |  | ○ | ○ |
| Heat conductivity of composition before diluent addition (W/m ° C.) |  |  | 6.0 |  |  |  | 6.0 | 6.0 |
| Heat conductivity of composition (W/m ° C.) |  |  | 5.9 |  |  |  | 4.0 | 4.0 |
| Viscosity after 5 days (Pa-s) |  |  | 600 |  |  |  | 230 | 130 |
| Viscosity after 8 days (Pa-s) |  |  | 600 |  |  |  | 250 | 190 |
| Viscosity after 15 days (Pa-s) |  |  | 600 |  |  |  | 300 | 290 |
| Applicability after 15 days |  |  | X |  |  |  | Δ | Δ |

The components in Tables 1 and 2 are identified below.

Component (A)

A-1:

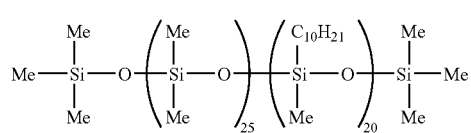

viscosity 390 mm²/s

A-2:

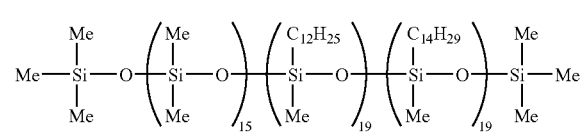

viscosity 500 mm²/s

A-3:

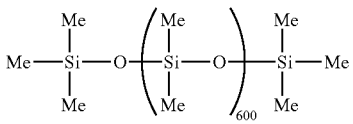

viscosity 5,000 mm²/s

Component (B)

B-1:

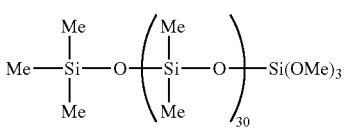

viscosity 30 mm²/s

Component (C)
  C-1: aluminum powder
    (irregular, average particle size 7 μm)
  C-2: zinc oxide powder
    (irregular, average particle size 0.3 μm)
  C-3: alumina powder
    (spherical, average particle size 0.6 μm)
Component (D)
  D-1: IP Solvent 2835
    (isoparaffin solvent, by Idemitsu Kosan Co., Ltd.), boiling point 270-350° C.
  D-2: Isosol 400
    (isoparaffin solvent, by Nippon Oil Corp.), boiling point 210-254° C.
Organosilane-1: $C_{10}H_{21}Si(OCH_3)_3$ Japanese Patent Application No. 2007-116598 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A heat dissipating silicone grease composition comprising, in % by weight,
   (A) 0 to 30% of an organopolysiloxane represented by the general formula (1):

$$R^1_a SiO_{(4-a)/2} \quad (1)$$

wherein $R^1$ is at least one radical selected from substituted or unsubstituted monovalent hydrocarbon radicals of 1 to 18 carbon atoms, and "a" is a positive number from 1.8 to 2.2, and having a kinematic viscosity of 50 to 500,000 mm$^2$/s at 25° C.,
   (B) 0 to 30% of an organopolysiloxane represented by the general formula (2):

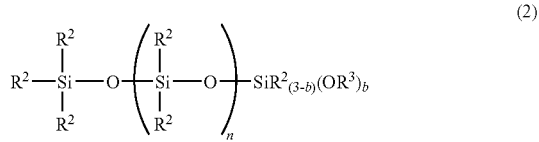

(2)

wherein $R^2$ is each independently a substituted or unsubstituted monovalent hydrocarbon radical, $R^3$ is each independently an alkyl, akoxyalkyl, alkenyl or acyl radical, n is an integer of 5 to 100, and "b" is an integer of 1 to 3, the sum of components (A) and (B) being in a range of 3 to 30%,
   (C) 60 to 96.9% of a heat conductive filler having a heat conductivity of at least 10 W/m° C.,
   (D) 0.1 to 10% of a least volatile isoparaffin having a boiling point 270 to 350° C., in which components (A) and (B) are dispersible or dissolvable,
   the sum of components (A) to (D) being 100%.

2. A heat dissipating silicone grease composition comprising, in % by weight,
   (A) 0 to 30% of an organopolysiloxane represented by the general formula (1):

$$R^1_a SiO_{(4-a)/2} \quad (1)$$

wherein $R^1$ is at least one radical selected from substituted or unsubstituted monovalent hydrocarbon radicals of 1 to 18 carbon atoms, and "a" is a positive number from 1.8 to 2.2, and having a kinematic viscosity of 50 to 500,000 mm$^2$/s at 25° C.,
   (B) 0 to 30% of an organopolysiloxane represented by the general formula (2):

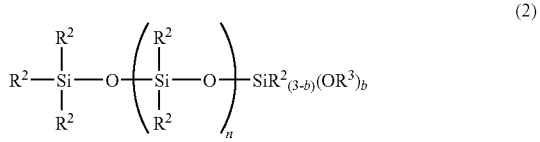

(2)

wherein $R^2$ is each independently a substituted or unsubstituted monovalent hydrocarbon radical, $R^3$ is each independently an alkyl, akoxyalkyl, alkenyl or acyl radical, n is an integer of 5 to 100, and "b" is an integer of 1 to 3, the sum of components (A) and (B) being in a range of 3 to 30%,
   (C) 60 to 96.9% of a heat conductive filler having a heat conductivity of at least 10 W/m° C.,
   (D) 0.1 to 10% of a least volatile isoparaffin having a boiling point of 270 to 350° C., in which components (A) and (B) are dispersible or dissolvable; and
   (E) 0.1 to 10 parts by weight of an organosilane having the general formula (3):

$$R^4_c R^5_d Si(OR^6)_{4-c-d} \quad (3)$$

wherein $R^4$ is a substituted or unsubstituted alkyl radical of 6 to 20 carbon atoms, $R^5$ is a substituted or unsubstituted monovalent hydrocarbon radical of 1 to 20 carbon atoms, $R^6$ is an alkyl radical of 1 to 6 carbon atoms, c is an integer of 1 to 3, d is an integer of 0 to 2, and c+d is an integer of 1 to 3, or a partial hydrolytic condensate thereof, per 100 parts by weight of components (A) to (D) combined;
   wherein the sum of components (A) to (E) is 100%.

3. The heat dissipating silicone grease composition as claimed in claim 1, wherein "a" is a positive number from 1.9 to 2.2.

4. The heat dissipating silicone grease composition as claimed in claim 1, wherein the organopolysiloxane (A) has a kinematic viscosity of 100 to 10,000 mm$^2$/s at 25° C.

5. The heat dissipating silicone grease composition as claimed in claim 1, wherein the organopolysiloxane (A) is present in an amount of from 0 to 15 wt %.

6. The heat dissipating silicone grease composition as claimed in claim 1, wherein "b" is 3.

7. The heat dissipating silicone grease composition as claimed in claim 1, wherein the organopolysiloxane component (B) is present in an amount of 0 to 15% by weight.

8. The heat dissipating silicone grease composition as claimed in claim 1, wherein the organopolysiloxane component (B) has a kinematic viscosity of 10 to 10,000 mm$^2$/s at 25° C.

9. The heat dissipating silicone grease composition as claimed in claim 1, wherein the sum of components (A) and (B) is in a range of from 3 to 30% by weight based on the composition.

10. The heat dissipating silicone grease composition as claimed in claim 1, wherein the heat conductive filler (C) is at least one member selected from the group consisting of aluminum powder, copper powder, silver powder, nickel powder, gold powder, alumina powder, zinc oxide powder, magnesium oxide powder, aluminum nitride powder, boron nitride powder, silicon nitride powder, diamond powder, carbon powder, and mixtures thereof.

11. The heat dissipating silicone grease composition as claimed in claim 1, wherein the least volatile isoparaffin (D) is present in an amount of 0.5 to 5% by weight.

12. The heat dissipating silicone grease composition as claimed in claim 2, wherein "a" is a positive number from 1.9 to 2.2.

13. The heat dissipating silicone grease composition as claimed in claim 2, wherein the organopolysiloxane (A) has a kinematic viscosity of 100 to 10,000 mm$^2$/s at 25° C.

14. The heat dissipating silicone grease composition as claimed in claim 2, wherein the organopolysiloxane (A) is present in an amount of from 0 to 15 wt %.

15. The heat dissipating silicone grease composition as claimed in claim 2, wherein "b" is 3.

16. The heat dissipating silicone grease composition as claimed in claim 2, wherein the organopolysiloxane component (B) is present in an amount of 0 to 15% by weight.

17. The heat dissipating silicone grease composition as claimed in claim 2, wherein the organopolysiloxane component (B) has a kinematic viscosity of 10 to 10,000 mm$^2$/s at 25° C.

18. The heat dissipating silicone grease composition as claimed in claim 2, wherein the sum of components (A) and (B) is in a range of from 3 to 30% by weight based on the composition.

19. The heat dissipating silicone grease composition as claimed in claim 2, wherein the heat conductive filler (C) is at least one member selected from the group consisting of aluminum powder, copper powder, silver powder, nickel powder, gold powder, alumina powder, zinc oxide powder, magnesium oxide powder, aluminum nitride powder, boron nitride powder, silicon nitride powder, diamond powder, carbon powder, and mixtures thereof.

20. The heat dissipating silicone grease composition as claimed in claim 2, wherein the least volatile isoparaffin (D) is present in an amount of 0.5 to 5% by weight.

* * * * *